United States Patent [19]
Roberts et al.

[11] Patent Number: 5,976,763
[45] Date of Patent: Nov. 2, 1999

[54] HIGHLY SENSITIVE WATER-DEVELOPABLE PHOTOREACTIVE RESIN COMPOSITIONS AND PRINTING PLATES PREPARED THEREFROM

[76] Inventors: David H. Roberts, 2704 Levante St., Carlsbad, Calif. 92009; Mitch G. Male, 3609 Grand Ave., San Marcos, Calif. 92069

[21] Appl. No.: 08/812,103

[22] Filed: Mar. 5, 1997

[51] Int. Cl.$^6$ ...................................................... G03C 1/73
[52] U.S. Cl. ..................................... 430/286.1; 430/283.1; 430/287.1; 430/910; 522/14; 522/26; 522/28
[58] Field of Search .............................. 430/286.1, 283.1, 430/281.1, 287.1, 910; 522/14, 26, 28

[56] References Cited

U.S. PATENT DOCUMENTS

| | | | |
|---|---|---|---|
| 4,323,637 | 4/1982 | Chen et al. | 430/281.1 |
| 4,369,246 | 1/1983 | Chen et al. | 430/281.1 |
| 4,622,088 | 11/1986 | Min | 430/281.1 |
| 4,806,450 | 2/1989 | Hofmann et al. | 430/286.1 |
| 5,073,477 | 12/1991 | Kusuda et al. | 430/286.1 |
| 5,175,076 | 12/1992 | Ishikawa et al. | 430/286.1 |
| 5,348,844 | 9/1994 | Garmong | 430/286.1 |

*Primary Examiner*—Maria Nuzzolillo
*Assistant Examiner*—Laura Weiner
*Attorney, Agent, or Firm*—Gray Cary Ware & Friedenrich; Stephen E. Reiter

[57] ABSTRACT

In accordance with the present invention, there are provided highly sensitive, water-developable photoreactive resin compositions useful for the preparation of printing plates. Due to the high sensitivity of invention resin compositions, they are particularly useful for preparation of digitally imaged printing plates. Printing plates prepared employing invention compositions are characterized as having excellent exposure sensitivity, the capability of rapidly curing upon exposure, excellent retention of fine details, and excellent colorless performance. Moreover, printing plates prepared employing invention compositions have good clarity and flexibility, excellent washout properties, and retain such properties over extended periods of storage. Once photopolymerized, printing plates of the invention have excellent physical properties, enabling their use in many very demanding flexographic applications.

12 Claims, No Drawings

HIGHLY SENSITIVE WATER-DEVELOPABLE PHOTOREACTIVE RESIN COMPOSITIONS AND PRINTING PLATES PREPARED THEREFROM

FIELD OF THE INVENTION

The present invention relates to resin compositions which are useful for the preparation of digitally imaged printing plates. Invention compositions are highly reactive to photocuring conditions and are readily water-developable.

BACKGROUND OF THE INVENTION

Photosensitive resins used for the manufacture of relief printing plates are preferably developable with water rather than organic solvent for various reasons such as ease of handling, health of workers who come in contact therewith, safety, and avoidance of environmental pollution. Printing plates employed for flexographic printing must be capable of printing on a variety of substrates, which vary widely in their composition and surface uniformity. Substrates employed for flexographic printing include metal foils, plastic films, kraft paper, corrugated board, laminated papers and boards, newsprint, and the like. In order to successfully print on this wide variety of substrates, one must use a variety of ink types and printing press conditions.

The ideal printing plate for use in flexographic printing applications would be one which is capable of withstanding the potentially deleterious effects of the agents which are likely to come in contact therewith, i.e., common ink solvents, developing media (e.g., water), and radiation-cured materials. The ideal printing plate will further show no tendency to crack when flexed, and will be soft enough to conform to irregular surfaces, yet durable enough to withstand the forces of the printing process. It is also desirable that the resin material employed for the preparation of printing plates resist cracking or degradation when exposed to ozone in ambient air.

Another desirable feature of resin materials employed for the production of printing plates is a sufficient level of sensitivity and reactivity so as to allow digital imaging thereof. Digital imaging is expanding rapidly in all areas of the graphic arts. Ongoing advances in cameras, computers, networks and software are making it increasingly easy to capture, transmit, manipulate and render images composed entirely of electronic bits. The use of completely digital pre-press processes is becoming more and more commonplace in many areas of printing. A key step in digital pre-press processes is computer pagination, where all of the components of a page image are "pasted-up" electronically while displayed on a computer monitor.

Once paginated, the logical next step is to produce printing plates directly from the digital page data. Devices that enable this direct production of printing plates are commonly called platesetters, which are an essential component of computer-to-plate (CTP) technology. No film is required and there are no intermediate renditions of the image between the original art (text, photos, ads, and the like) and the printing plate. The pre-press page flow is, therefore, reduced by one or more steps.

Flexographic printers realize a number of advantages upon adoption of digital technology, in general, and digital platemaking, in particular. Firstly, print quality is improved. This includes better vignetting, tighter registration, sharper line work, and more open shadows/midtones. On-press registration is also better, which adds to the quality improvement for process color as well as reduces startup paper waste—a significant advantage with higher cost papers.

The elimination of film is another important goal for flexographic printers, since film costs can be $0.40–$0.75 or more per square foot (including chemicals). Other film related costs include the purchase and maintenance of capital equipment (page cameras, imagesetters, processors and punch units), manpower and waste treatment. The manpower requirements of CTP plate production are reduced because there is no longer a need to handle, inspect and opaque film. The treatment of heavy metal (silver) waste is also eliminated. Indeed, computer-to-plate technology totally obviates this environmental concern and its associated costs.

Platesetters for offset plates have been commercially available for a number of years. Because of the thinness of offset coating (1–2 microns), the technology to image offset plates is less demanding than that needed for flexo's thick relief (>355 microns). The offset technology is now field proven and offered by more than 20 vendors in a myriad of configurations. For example, one can choose from blue, green or infra-red lasers in either external drum, internal drum or flatbed formats.

In flexography, there are currently two commercially available technologies, i.e., laser ablation and mask ablation. In laser ablation, a high power carbon dioxide laser, controlled by a computer, blasts away the non-image area of a solid rubber plate. The imaging speed is only about 1 $m^2$ per hour, however, which is too slow for many applications. The laser ablation approach also lacks the ability to resolve the detail of fine halftone screens.

In mask ablation, a photopolymer is manufactured with a thin, opaque layer on top. The opaque layer is then ablated away in the image area by an IR laser to create a mask directly on the surface. The underlying photopolymer is then exposed through the mask with conventional UV lamps, and solvent processed. Imaging employing this technique is slow, however (~1 $m^2$/h), and the mask technology adds significantly to the cost of the printing plate.

What is needed in the field of flexographic printing is high sensitivity photopolymer capable of direct exposure by a rapidly moving laser beam to produce plates of high quality. Currently, there are no commercially available flexographic resins which are capable of rapid, direct exposure by lasers.

Several types of photosensitive resin formulations have been developed for use in flexographic printing. Photosensitive resin plates prepared employing modified thermoplastic elastomeric rubber or rubber-like printing media have excellent mechanical properties, but can be processed only in organic media. See, for example, U.S. Pat. Nos. 4,323, 637, 4,369,246 and 4,622,088. None of the photosensitive resin formulations described in the art are sufficiently photoreactive, however, to allow digital imaging thereof.

More recently, solid flexographic printing plates which are developable in water have been described. See, for example, U.S. Pat. No. 5,348,844 (which describes photosensitive printing media having a composite structure comprising discrete domains of water-dispersible latex copolymer and a photopolymerizable interstitial phase) and U.S. Pat. No. 5,073,477 (which describes photosensitive resins comprising a latex copolymer component, a liquid or solid copolymer component, a basic nitrogen atom-containing compound, an ethylenically unsaturated compound and a photoinitiator). The solid photosensitive resin formulations described in '844 and '477 are not sufficiently photoreactive, however, to allow digital imaging thereof.

In summary, each of the above-described systems suffer from certain drawbacks which limit the usefulness thereof, e.g., the resulting resins undergo excessive swell in aqueous inks (which results in poor image reproduction), the resulting resins lack sufficient structural integrity to withstand the physical rigors of flexographic printing operations, the resulting resins produce materials which are excessively hard or soft (and hence do not meet the performance requirements of flexo users), the resulting resins still require the use of washout aids (e.g., acid, alkali, surfactant, etc.), in the aqueous media employed for developing the resulting printing plate, the resulting resins lack sufficient storage stability to allow long-term storage of printing plates prior to photopolymerization thereof (i.e., washout of unexposed material becomes more difficult upon extended storage) and/or the resulting resins are not sufficiently reactive to allow digital imaging thereof. Accordingly, what is still needed in the art are resins useful for the production of flexographic printing plates which have improved photosensitivity and physical properties.

BRIEF DESCRIPTION OF THE INVENTION

In accordance with the present invention, we have developed highly sensitive, water-developable photoreactive resin compositions useful for the preparation of printing plates. Due to the high sensitivity of invention resin compositions, they are particularly useful for preparation of digitally imaged printing plates. Printing plates prepared employing invention compositions are characterized as having excellent exposure sensitivity, the capability of rapidly curing upon exposure, excellent retention of fine details, and excellent colorless performance. Moreover, printing plates prepared employing invention compositions have good clarity and flexibility, excellent washout properties, and retain such properties over extended periods of storage.

Once photopolymerized, printing plates of the invention have excellent physical properties, enabling their use in a variety of demanding printing applications, e.g., tag, label, preprint, newspaper, directory, and the like. Such applications require the photopolymerized resin to have excellent water resistance (so that exposure to water-based inks does not significantly alter resin properties). In addition, such applications require the photopolymerized resin to produce a sharp image (i.e., to display excellent retention of fine details), to have excellent colorless properties, to have high resilience (so that the physical contacting associated with the printing process does not significantly degrade resin properties), to have excellent on-press durability, good ink transfer properties, and the like.

Photopolymerized resins of the invention maintain a good balance of resin properties such as tensile strength, percent elongation, hardness, resilience, and flexibility, without compromising the demands of printers for good reproduction of negative to a printed image. The base resin, before polymerization, must also maintain the key property of being easily developed in an entirely aqueous medium, even after months of storage before curing. At the same time, the base resin must retain its ability for rapid cure upon exposure to initiating radiation, while the cured material must be resistant to swell upon exposure to a wide variety of materials, including water. Photopolymerization of invention resin yields a product with ink transfer characteristics considered acceptable by flexographic printing standards and demonstrates sufficient toughness and flexibility for extended printing runs as required in many areas of the flexographic printing market.

DETAILED DESCRIPTION OF THE INVENTION

In accordance with the present invention, there are provided highly sensitive, water-developable photoreactive resin compositions comprising:

(A) in the range of about 25 up to about 75 wt % of at least one copolymer comprising in the range of:
(i) about 5 up to about 95 mol % of at least one aliphatic conjugated diene monomer,
(ii) about 1 up to about 30 mol % of at least one α,β-ethylenically unsaturated carboxylic acid,
(iii) about 0.1 up to about 10 mol % of at least one polyfunctional vinyl monomer, and
(iv) 0 up to about 70 mol % of at least one monofunctional vinyl monomer;

(B) in the range of about 0.2 up to about 2 mol of at least one washout aid per mol of carboxyl groups in copolymer (A), (C) in the range of about 2.5 up to about 20 wt % of a linear thermoplastic, elastomeric block polymer having at least one unit of the general formula (A-B-A), (A-B)$_n$ or (A-B), wherein A is a non-elastomeric polymer block having a number average molecular weight of 2,000 to 100,000 and a glass transition temperature above about 25° C., and B is an elastomeric polymer block having a number average molecular weight of about 25,000 to about 1,000,000 and a glass transition temperature below about 10° C., (D) in the range of about 0 up to about 12 wt % of at least one monofunctional, ethylenically unsaturated monomer having the structure:

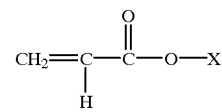

wherein X is an alkyl group having in the range of about 8 up to about 18 carbon atoms, (E) in the range of about 5 up to about 25 wt % of at least one polyfunctional, ethylenically unsaturated monomer having the core structure:

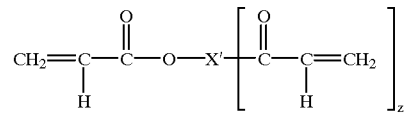

wherein X' is selected from:
(a) alkylene or substituted alkylene having in the range of 1 up to about 15 carbon atoms, when z is 1, or
(b) oxyalkylene or substituted oxyalkylene having in the range of 1 up to about 150 carbon atoms, when z is 1, or
(c) a polyvalent alkylene or oxyalkylene moiety, when z is 2 or 3, and (F) in the range of about 0.01 up to about 10 wt % of a phosphine-containing photopolymerization initiation system.

Copolymers (component (A) of the above-described compositions) contemplated for use in the practice of the present invention are prepared from a combination of several components, e.g., an aliphatic conjugated diene monomer, an α,β-ethylenically unsaturated carboxylic acid, a polyfunctional vinyl monomer, and optionally a monofunctional vinyl monomer. Typically, such compositions comprise in the range of about:

(i) 5 up to 95 mol % of at least one aliphatic conjugated diene monomer,
(ii) 1 up to 30 mol % of at least one α,β-ethylenically unsaturated carboxylic acid, (iii) 0.1 up to 10 mol % of at least one polyfunctional vinyl monomer, and (iv) 0 up to 70 mol % of at least one monofunctional vinyl monomer.

Preferred copolymer compositions employed in the practice of the present invention comprise in the range of about:

(i) 40 up to 85 mol % of at least one aliphatic conjugated diene monomer, (ii) 2.5 up to 15 mol % of at least one α,β-ethylenically unsaturated carboxylic acid, (iii) 0.5 up to 5 mol % of at least one polyfunctional vinyl monomer, and (iv) 5 up to 30 mol % of at least one monofunctional vinyl monomer.

Aliphatic conjugated diene monomers contemplated for use in the practice of the present invention include butadiene, isoprene, chloroprene, dimethylbutadiene, and the like.

α,β-ethylenically unsaturated carboxylic acids contemplated for use in the practice of the present invention include methacrylic acid, acrylic acid, itaconic acid, maleic acid, β-carboxyethyl acrylate (β-CEA), β-carboxyethyl methacrylate, and the like, as well as mixtures of any two or more thereof.

As used herein, the term "polyfunctional vinyl monomers" refers to compounds having more than one α,β-ethylenic site of unsaturation. Polyfunctional vinyl monomers contemplated for use in the practice of the present invention include ethyleneglycol di(meth)acrylate (i.e., ethyleneglycol diacrylate or ethyleneglycol dimethacrylate), divinyl benzene, 1,6-hexanediol di(meth)acrylate, 1,4-butanediol di(meth)acrylate, and the like.

As used herein, the term "monofunctional vinyl monomers" refers to compounds having only one α,β-ethylenic site of unsaturation. Monofunctional vinyl monomers contemplated for use in the practice of the present invention include ethyl (meth)acrylate (i.e., ethyl acrylate or ethyl methacrylate), methyl (meth)acrylate, hydroxyethyl (meth) acrylate, dimethylaminopropyl (meth)acrylate, diethylaminopropyl (meth)acrylate, dimethylaminopropyl (meth) acrylamide, diethylaminopropyl (meth)acrylamide, and the like, as well as mixtures of any two or more thereof.

Invention compositions typically contain in the range of about 25–75 wt % of component A of the above-described composition. Preferred compositions of the invention contain in the range of about 35–65 wt % of component A of the above-described composition. Presently most preferred photopolymerizable compositions are those having in the range of about 40–60 wt % of component A, based on the weight of the total composition.

Washout aids (component (B) of the above-described composition) contemplated for use in the practice of the present invention include basic nitrogen-containing compounds, alkali metal hydroxides, alkali metal carbonates, alkali metal salts of organic acids, and the like, as well as mixtures of any two or more thereof.

Basic nitrogen-containing compounds contemplated for use in the practice of the present invention include N,N-dialkylaminoalkyl (meth)acrylamides (e.g., N,N-dimethylaminopropyl methacrylamide (DMAPMA) or N,N-dimethylaminoethyl methacrylamide (DMAEMA)), N,N-dimethyldodecylamine (DDA), N,N-dimethylaminopropylamine (DAPA), N,N-dimethyltoluidine (DMT), triphenylamine (TPA), diethylamine (DEA), triethylamine (TEA), N,N-diethylaminoethanol (DEAE), N,N-dimethylaminopropanol (DMA), N,N-dimethylaminopropanamine (DMAP), alkyldimethylamine ADMA-C2 or alkyldimethylamine ADMA-C8 (available from Ethyl Corporation, Baton Rouge, La.), N,N-dimethylamino-ethylmethacrylate (Ageflex FM2), N(N,N-dimethylamino)-propyl-2-pyrrolidone (DMAPP), 1,3-bis(dimethylamino)-propane (BDAP), 1,6-bis(dimethylamino)hexane (BDAH),

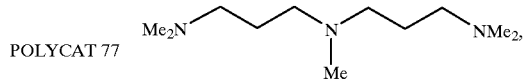

POLYCAT 77

(Air Products, Inc., Allentown, Pa.),

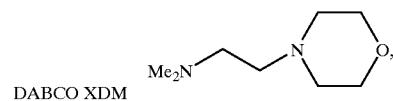

DABCO XDM

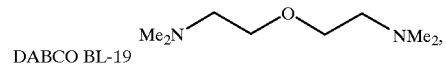

DABCO BL-19

(the DABCO's are products of Air Products, Inc., Allentown, Pa.), and the like, as well as mixtures of any two or more thereof.

Alkali metal hydroxides contemplated for use in the practice of the present invention include sodium hydroxide, potassium hydroxide, lithium hydroxide, cesium hydroxide, and the like, as well as mixtures of any two or more thereof. Alkali metal carbonates contemplated for use in the practice of the present invention include sodium carbonate, potassium carbonate, lithium carbonate, cesium carbonate, and the like, as well as mixtures of any two or more thereof.

Alkali metal salts of organic acids contemplated for use in the practice of the present invention include sodium formate, sodium acetate, sodium propionate, sodium butyrate, sodium oxalate, sodium oleate, potassium formate, potassium acetate, potassium propionate, potassium butyrate, potassium oxalate, potassium oleate, lithium formate, lithium acetate, lithium propionate, lithium butyrate, lithium oxalate, lithium oleate, cesium formate, cesium acetate, cesium propionate, cesium butyrate, cesium oxalate, cesium oleate, and the like, as well as mixtures of any two or more thereof.

Invention compositions typically contain in the range of about 0.2–2 mols of component B (per mol of carboxyl in copolymer (A)). Preferred compositions of the invention contain in the range of about 0.5–1.5 mols of component B (per mol of carboxyl in copolymer (A)), with photopolymerizable compositions having in the range of about 0.8–1.2 mols of component B (per mol of carboxyl in copolymer (A)) being the presently most preferred.

Linear, thermoplastic, elastomeric block polymers (component (C) of the above-described compositions) contemplated for use in the practice of the present invention can be either water-dispersible or non-dispersible in water, and have at least one unit from the general formula (A-B-A), (A-B)$_n$, or (A-B), where each A is a non-elastomeric polymer block having a number average molecular weight in the range of 2,000 to 100,000 and a glass transition temperature above about 25° C. Each A block is appended to an elastomeric block B, where each B has a number average molecular weight in the range of 25,000 to 1,000,000 and a glass transition temperature below about 10° C. The (A-B-A), (A-B)$_n$ or (A-B) units may describe the general formula of the block copolymer, or additional (A-B-A), (A-B)$_n$ or (A-B) units may be appended to it to form a repeating structure. It is possible to vary the nature of the A and B units, for example, by using two different terminal, non-elastomeric A blocks within the (A-B-A), (A-B)$_n$ or (A-B) structure, or by using two or more different elastomeric materials within the B block. Additionally, the repeating structure may be appended to another polymer.

The non-elastomeric polymeric unit A is typically the polymerization product of aromatic hydrocarbons containing vinyl unsaturation. Preferably, the non-elastomeric unit A is polystyrene. The elastomeric unit B is typically the polymerization product of aliphatic conjugated diolefinic compounds such as 1,3-butadiene, isoprene, and the like. Preferably, the elastomeric unit B is polybutadiene or polyisoprene.

A presently preferred linear, thermoplastic, block copolymer for use in the practice of the present invention is a block copolymer of polystyrene attached to each end of a middle block of polybutadiene, polyisoprene or polychloroprene. Such preferred block polymers include, for example, polystyrene-polybutadiene-polystyrene, polystyrene-polyisoprene-polystyrene, and the like, with the polyolefin block being 80–90 percent, by weight, of the block copolymer. Examples of useful thermoplastic elastomer block copolymers include materials manufactured by Shell Chemical Co., and sold under the trademark Kraton, materials manufactured by Enichem Elastomers Americas, Inc., and sold under the trademark Europrene, and the like.

Invention compositions typically contain in the range of about 2.5 up to about 20 wt % of the linear, thermoplastic, elastomeric block polymer (component C of the above-described composition). Preferred compositions of the invention contain in the range of about 3.5 up to about 15 wt % of the linear, thermoplastic, elastomeric block polymer (component C of the above-described composition), with photopolymerizable compositions having in the range of about 5 up to about 10 wt % of component C, based on the weight of the total composition, being the presently most preferred.

Monofunctional, ethylenically unsaturated monomers (component (D) of the above-described composition) contemplated for use in the practice of the present invention include compounds having the core structure:

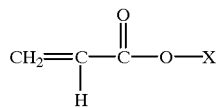

wherein X is a straight chain or branched chain alkyl group having in the range of about 8 up to about 18 carbon atoms.

Exemplary monofunctional, ethylenically unsaturated monomers contemplated for use in the practice of the present invention include caprylyl acrylate, capryl acrylate, lauryl acrylate, myristyl acrylate, palmityl acrylate, stearyl acrylate, oleyl acrylate, and the like, as well as mixtures of any two or more thereof. Presently preferred monofunctional ethylenically unsaturated monomers contemplated for use in the practice of the present invention include lauryl acrylate, tridecyl acrylate, and the like, as well as mixtures of any two or more thereof.

Invention compositions typically contain up to about 12 wt % of monofunctional, ethylenically unsaturated monomer(s) (i.e., component D of the above-described composition). Preferred compositions of the invention contain in the range of about 2 up to about 10 wt % of monofunctional, ethylenically unsaturated monomer(s), with photopolymerizable compositions having in the range of about 4 up to about 8 wt % of monofunctional, ethylenically unsaturated monomer(s) being the presently most preferred.

Polyfunctional, ethylenically unsaturated monomers (component (E) of the above-described composition) contemplated for use in the practice of the present invention include compounds having the core structure:

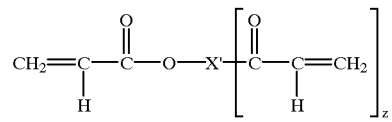

wherein X' is selected from:
(a) alkylene or substituted alkylene having in the range of 1 up to about 15 carbon atoms, when z is 1, or
(b) oxyalkylene or substituted oxyalkylene having in the range of 1 up to about 150 carbon atoms, when z is 1, or
(c) a polyvalent alkylene or oxyalkylene moiety, when z is 2 or 3.

Exemplary polyfunctional, ethylenically unsaturated monomers contemplated for use in the practice of the present invention include 1,4-butanediol diacrylate, 1,6-hexanediol diacrylate, polyethylene glycol diacrylate, ethoxylated trimethylol propane triacrylate, propoxylated neopentyl glycol diacrylate, ethoxylated bisphenol A diacrylate, propoxylated glyceryl triacrylate, and the like, as well as mixtures of any two or more thereof. Presently preferred polyfunctional ethylenically unsaturated monomers contemplated for use in the practice of the present invention include polyethylene glycol diacrylate, ethoxylated trimethylol propane triacrylate, and the like, as well as mixtures of any two or more thereof.

Invention compositions typically contain in the range of about 5 up to about 25 wt % of polyfunctional, ethylenically unsaturated monomer(s) (i.e., component E of the above-described composition). Preferred compositions of the invention contain in the range of about 8 up to about 20 wt % of polyfunctional, ethylenically unsaturated monomer(s), with photopolymerizable compositions having in the range of about 10 up to about 14 wt % of polyfunctional, ethylenically unsaturated monomer(s) being the presently most preferred.

Phosphine-containing photopolymerization initiation systems contemplated for use in the practice of the present invention (i.e., component (F) of the above-described composition) comprise at least one phosphine-containing photoinitiator and, optionally, one or more non-phosphorus-containing photoinitiators. Those of skill in the art recognize that a wide range of phosphine-containing photoinitiators, as well as a wide range of non-phosphorus-containing photoinitiators can be used in the practice of the present invention. Exemplary phosphine-containing photoinitiators contemplated for use herein include 2,6-dimethoxybenzoylphenylphosphinate, 2,6-dimethylbenzoyl diphenylphosphine oxide, 2,4,6-trimethylbenzoyl diphenylphosphine oxide, bis(2,6-dimethoxybenzoyl)-2,4,4-trimethylpentyl phosphine oxide, ethyl 2,4,6-trimethylbenzoylphenylphosphinate, and the like, as well as mixtures of any two or more thereof.

Exemplary non-phosphorus-containing photoinitiators contemplated for use herein include hydrogen abstractiontype initiators (e.g., xanthone, thioxanthone, 2-chloroxanthone, benzil, benzophenone, 4,4'bis(N,N'-dimethylamino)benzophenone, polynuclear quinones (e.g., 9,10-anthraquinone, 9,10-phenanthrenequinone, 2-ethyl anthraquinone, 1,4-naphthoquinone), and the like), α-diketone compounds or monoketal derivatives thereof (e.g., diacetyl, benzil, benzyl dimethyl ketal, and the like), acyloins (e.g., benzoin, pivaloin, and the like), acyloin ethers (e.g., benzoin methyl ether, benzoin ethyl ether, benzoin propyl ether, and the like), acyl phosphine oxides, hydroxyalkyl acetophenones (e.g., 1-hydroxycyclohexyl phenyl ketone, 2-hydroxy-2-methyl-1-phenyl propan-1-one), and the like, as well as mixtures of any two or more thereof.

The initiator system (F) is typically added in an amount in the range of about 0.01 up to about 10 wt %, based on the total weight of the composition. Presently preferred amounts fall in the range of about 0.05 to about 5 wt %, based on the total weight of the composition. It is also presently preferred that the ratio of the phosphine-containing photoinitiator component to the non-phosphorus-containing photoinitiator fall in the range of about 1:1 up to about 1:10.

Invention compositions may further contain a variety of additives to improve processability and handling characteristics. For example, invention compositions may optionally contain a plasticizer and/or emulsifier. The optional added presence of plasticizer acts to reduce the glass transition temperature of the cured resin, thereby reducing hardness and modulus, thereby improving the printing performance thereof. The added presence of emulsifier may act to facilitate washout of unreacted formulation from printing plates which have been exposed to electromagnetic radiation.

As used herein, the term "plasticizer" refers to a relatively low molecular weight material of very low softening point which associates strongly with at least one of the phases of the invention polymeric system, which comprises discrete domains of copolymer, discrete domains of elastomer, and a photopolymerizable interstitial phase that binds the domains of copolymer and elastomer together (and also contains photopolymerizable compound(s) and photoinitiator (s)).

Examples of plasticizers contemplated for use in the practice of the present invention include sulfonamides (e.g., N-butylbenzene sulfonamide (BBSA), N,N'-(2-methyl-1,5-pentanediyl)bis-benzenesulfonamide (HDP-S), N-ethyltoluene sulfonamide (e.g., Rit-cizer 8 (available from Rit Chemical, Pleasantville, N.Y.); paraffinic/naphthenic waxes or oils, such as Renoil 518 (available from Renkert Oil, Elverson, Pa.), Cyclolube 4053 (available from Witco, Golden Bear Division, Los Angeles, Calif.), Shellflex 371 (available from Shell Oil Co., Houston, Tex.), Indopol L-50 (an isobutylene/butene copolymer available from Amoco Chemical Co., Chicago, Ill.), and the like; mixed olefin waxes or oils such as the Wingtack series available from Goodyear, Akron, Ohio; polyterpene waxes or oils such as Piccolyte S25 (available from Hercules, Wilmington, Del.), Zonarez Alpha 25 (available from Arizona Chemical Co., Panama City, Fla.), and the like; alkylaryl resins such as Piccovar AP10 (available from Hercules); paraffinic waxes such as the Shellwax series (available from Shell Oil Co.) or Sun 5512 (available from Sun Chemical, Ft. Lee, N.J.); microcrystalline waxes such as Sun 5825 (available from Sun Chemical), coumarone-indene copolymers, such as R-17 (available from Neville, Pittsburgh, Pa.), poly(alphamethyl styrene), such as Piccotex (available from Hercules Chemical Co.), ethoxylated phenol, ethoxylated glycerol, and the like, as well as mixtures of any two or more thereof.

When present, invention compositions typically contain in the range of about 0.5–20 wt % plasticizer, based on the total weight of the above-described composition. Preferred compositions of the invention contain in the range of about 2–15 wt % plasticizer, with photopolymerizable compositions having in the range of about 4–12 wt % plasticizer being the presently most preferred.

Other additives contemplated for incorporation into invention compositions include antioxidants, fillers, emulsifiers, and the like. If desired, for example, to increase storage stability of invention compositions, there may further be added a storage stabilizer such as hydroxyaromatic compounds (e.g., hydroquinone, p-methoxyphenol, p-t-butylcatechol, 2,6-di-t-butyl-p-cresol, pyrogallol, and the like); quinones (e.g., benzoquinone, p-toluquinone, p-xyloquinone, and the like); amines (e.g., N-phenyl-α-naphthylamine, and the like); imidazoles (e.g., methylbenzimidazole); and the like, in an amount of about 0.01 up to about 2 wt %, based on the total weight of the composition.

Invention compositions, after photopolymerization and development thereof, have excellent retention of fine details, excellent colorless performance, good resilience, excellent on-press durability and good ink transfer properties. Retention of fine details, colorless performance, resilience, on-press durability and ink transfer properties are all performance properties which can be readily determined (either empirically, qualitatively or quantitatively) by those of skill in the art.

Invention compositions, after photopolymerization and development thereof, also possess excellent physical properties, e.g., hardness, as measured by the Shore A test, of 50–75. In addition, invention compositions, after photopolymerization and development thereof, possess excellent tensile properties, e.g., a tensile strength of >190 g/mm$^2$ (as measured by the Instron Series IX analyzer), an elongation of >100% (preferably greater than about 150%), and a Young's modulus to 30% of <400 g/mm$^2$.

Further, invention compositions require very little time to go from raw plate to "press ready" (i.e., total processing time for exposure, washout and drying) For example, a plate having a 15.5 mil thickness of invention resin thereon can be press ready (employing standard processing conditions) in less than about 10 minutes. Those of skill in the art recognize that the processing time required for a given plate will vary based on the resin thickness, intensity of the irradiation employed to cure the plate, temperature of the washout media, and the like. Moreover, invention compositions produce plates which are not opaque and have sufficient flexibility that the imaged plate readily conforms to the negative.

One of the desirable characteristics of invention compositions is their developability with water of substantially neutral pH. Thus, there is no need to use pH modified (i.e., acidic or basic) media when developing invention compositions. Selective removal of the unreacted photo-sensitive composition layer is achieved by brushing or spraying the element with water heated to about 25–75° C. until the unreacted resin is removed to the desired depth Increased water temperature generally decreases the time required to remove the desired portions. It is important to use "soft" water, that is, water from which metallic cations such as $Ca^{+2}$, $Mg^{+2}$, and $Fe^{+2}$ have been removed, during the washing process. The presence of these inorganic cations impedes the dispersion of unpolymerized areas. Commonly available water softening systems (such as ion exchange systems) are suitable for pre-treating the water used to remove the unreacted photosensitive composition. The processed plate is dried in an oven at about 60–110° C. for a time sufficient to reduce the residual water content of the plate to a desirably low level. The processed plate is then post-exposed to ultraviolet (UV) light for about 15 seconds to 10 minutes to further toughen the plate. These last two steps are utilized in the processing of other types of photosensitive printing plates, but the required times are much longer for those other types of plate. Generally, no further surface treatments (such as oxidation), which are necessary for some other photosensitive printing plates, are needed before the plate can be used.

Photoset and developed compositions prepared according to the present invention can be used for printing immediately after drying, and hence, invention compositions can substantially improve the conventional complicated process and the time for producing rubber relief plates for flexographic printing.

A variety of flexographic inks (e.g., oil-based, alcohol-based, etc) can be used in flexographic printing using photopolymer relief plates made from invention composition. In addition, since invention composition, once photocured, has excellent water resistance (in spite of the high water dispersibility of uncured invention composition), aqueous flexographic inks can also be used therewith (consistent with the gradual shift in the printing field from solvent type flexographic inks to aqueous type flexographic inks). This shift is driven, in large part, by the desire to reduce the contribution to air and water pollution made by the printing industry. Furthermore, invention compositions are also compatible with uv curable inks.

Invention compositions not only provide resin relief plates for flexographic printing, but can also be widely utilized as a photosensitive material in various applications such as the production of relief plates for newspaper printing and ordinary commercial printing, name plates, printed circuit boards, displays, photoadhesives, and the like. In addition, photosensitive compositions of the invention can be used as photopolymerizable coatings.

In accordance with another embodiment of the present invention, there are provided water-developable photosensitive resin plates comprising a support having deposited thereon a layer of the above-described photosensitive resin compositions. Invention resin plates can be characterized as having excellent exposure sensitivity, the capability of rapidly curing upon exposure, excellent retention of fine details, excellent colorless performance, and the like, as well as having a high degree of flexibility (i.e., at least about 180°), excellent washout properties (i.e., unexposed composition can be readily removed from the plate with a relatively mild water wash, not requiring the presence of alkali or extreme temperatures), a non-tacky surface, and good clarity (i.e., providing a substantially transparent photopolymer layer which readily accepts incident radiation).

Invention resin plates, after photopolymerization and development thereof, are substantially resistant to swell (i.e., have a thickness increase, upon immersion in water for 24 hours at ambient conditions, of less than about 3%), have a soft, yet tough and resilient surface as measured by Shore A hardness, the Instron property of tensile strength, and good performance in the bounce test. These properties are important in achieving good performance of the resulting plate on press. In addition, ink transfer properties of invention photopolymer plates are improved with respect to solvent developable plates described in the prior art (e.g., U.S. Pat. No. 4,323,637).

Supports contemplated for use in the practice of the present invention can be prepared from a variety of materials, e.g., metal, plastic, paper, wood, glass, and the like. Exemplary support materials include steel, aluminum and plastic (e.g., polyethylene terephthalate). In a preferred embodiment of the present invention, the support is treated with a clear primer coat. Thus, for example, a presently preferred support contemplated for use in the practice of the present invention comprises a coated steel support having deposited thereon (for example, by roll coating) ~65 micron wet thickness of an aqueous-based adhesion layer of a composition containing urethane latex, thickeners and surfactants (but generally no pigment, which is typically added for anti-reflectance).

In accordance with yet another embodiment of the present invention, there are provided relief printing plates comprising a support having deposited thereon a photopolymerized layer of the above-described photosensitive resin compositions. Invention resin plates are characterized as having a rapid rate of cure, excellent retention of fine details, excellent colorless performance, good resilience, excellent on-press durability, good ink transfer properties, and the like, as well as having excellent physical properties, e.g., a soft, yet tough and resilient surface (as determined, for example, by Shore A test, tensile strength, elongation, and the like).

In accordance with still another embodiment of the present invention, there is provided a method for preparing water-developable photosensitive resin plates suitable for the manufacture of relief printing plates having excellent exposure sensitivity, the capability of rapidly curing upon exposure, excellent retention of fine details, excellent colorless performance, and the like, as well as a high degree of flexibility, excellent washout properties, a non-tacky surface, and good clarity. Invention method comprises depositing onto a suitable support a substantially homogenous, solvent-free combination of components (A), (B), (C), (D), (E) and (F), as described above.

"Depositing" of the above-described compositions onto support can be carried out in a variety of ways, e.g., by extrusion, roll coating, heat processing, solvent casting, and the like. These techniques can be readily carried out by those of skill in the art.

In accordance with a further embodiment of the present invention, there is provided a method for preparing relief printing plates characterized as having a rapid rate of cure, excellent retention of fine details, excellent colorless performance, good resilience, excellent on-press durability, good ink transfer properties, and the like, as well as having a soft, yet tough and resilient surface, good ink transfer properties, and providing a sharp image. Invention method comprises:

exposing a photosensitive resin plate according to the invention (as described above), to a pattern of electromagnetic radiation, wherein said electromagnetic radiation is of sufficient energy to promote the imagewise polymerization of said resin, and washing said plate with a sufficient quantity of water to remove the photosensitive resin composition from the non-imaged portions of said plate.

The invention will now be described in greater detail by reference to the following non-limiting examples.

EXAMPLE 1

Invention Composition A

A crosslinked copolymer was prepared from:
69 parts by weight butadiene,
20 parts methylmethacrylate,
9 parts methacrylic acid, and 2 parts divinyl benzene.

51.3 parts of the above-described copolymer was preblended with 7.5 parts of a styrene-isoprene-styrene block copolymer (commercially available from Shell as Kraton D1107) by repeated pressing on a hydraulic heat press until a uniform and clear pancake was obtained. The material was transferred to an eight inch two-roll mill, where the following liquid mixture of components were added slowly over about 1 hour at about 60° C.

10.0 wt % ethoxylated phenol, 5.8 wt % dimethylaminopropylmethacrylamide, 1.7 wt % Shellflex, 6.3 wt % lauryl acrylate, 6.3 wt % PEG 400 diacrylate, 7.5 wt % ethoxylated TMPTA, 0.5 wt % butylate hydroxytoluene, 0.5 wt % 2,4,6-trimethylbenzoyldiphenylphosphine oxide, and 2.6 wt % 1-hydroxycyclohexylphenyl ketone was preblended and slowly added to the rubber material on the roller mill. Milling was continued for at least 30 minutes until the mixed resin was homogeneous.

The resulting resin was calendered onto a coated steel substrate to a thickness of 15.5 mils. Physical properties and performance properties of the resulting plate are tested as described in Example 4, and results thereof summarized in Example 5.

EXAMPLE 2

Invention Composition B

Employing the same procedure as used in Example 1, 53.1 wt %, based on the total weight of the final composition, of the above-described crosslinked copolymer was heat pressed at 95° C. with 7.5 wt % (same basis) of Kraton D1107 until a uniform and clear pancake was obtained. This base rubber material was then transferred to a double roll mill and milled at 70° C. with the liquid portion of the formulation, which comprises:

10 wt % ethoxylated phenol, 6.3 wt % lauryl acrylate, 6.3 wt % PEG 400 diacrylate, 7.5 wt % ethoxylated TMPTA, 5.8 wt % DABCO XDM (Air Products, Inc.), 0.5 wt % butylated hydroxytoluene, 0.5 wt % 2,4,6-trimethylbenzoyldiphenylphosphine oxide, and 2.6 wt % 1-hydroxycyclohexylphenyl ketone Thus, the components of the liquid portion of the formulation were preblended and slowly added to the rubber material on the roller mill. Milling was continued for at least 30 minutes until the mixed resin was homogeneous.

The resulting resin was calendered onto a coated steel substrate to a thickness of 15.5 mils. Physical properties and performance properties of the resulting plate are tested as described in Example 4, and results thereof summarized in Example 5.

EXAMPLE 3

Comparison Composition

Employing the same procedure as used in Example 1, 57.2 wt %, based on the total weight of the final composition, of the above-described crosslinked copolymer was milled at 70° C. with the liquid portion of the formulation, which comprises:

5.5 wt % ethoxylated phenol, 2.8 wt % sorbitan monostearate, 2.0 wt % Ricon 142 (Ricon resins Inc.), 5.7 wt % dimethylaminopropylmethacrylamide, 11.7 wt % lauryl methacrylate, 2.7 wt % PEG 600 dimethacrylate, 5.5 wt % ethoxylated TMPTA, 2.4 wt % PEG 400 diacrylate, 2.0 wt % aliphatic urethane acrylate, 2.0 wt % benzil dimethyl ketal, and 0.5 wt % butylated hydroxytoluene.

Thus, the components of the liquid portion of the formulation were preblended and slowly added to the rubber material on the roller mill. Milling was continued for at least 30 minutes until the mixed resin was homogeneous.

The resulting resin was calendered onto a coated steel substrate to a thickness of 15.5 mils. Physical properties and performance properties of the resulting plate are tested as described in Example 4, and results thereof summarized in Example 5.

EXAMPLE 4

Test Methods

Slabs of cured photopolymer were prepared by repeatedly heat pressing the photopolymer resin into 0.067 inch thick frames between two sheets of polyester film until a bubble-free slab is obtained It was then cured by exposure to a 5 kilowatt medium pressure mercury lamp at a distance of 36 inches for five minutes on each side.

A. Resilience Test Method—Shore SR1 Resilometer

For resilience measurements, the cured resin was cut into four equal pieces (2.5 cm×2.5 cm), then stacked. The final stack height should be 12 mm±0.5 mm. The stack is then placed under a resilometer (Shore SR1 Resilometer, Shore Instrument and Manufacturing Co., Jamaica, N.Y.) and the plunger dropped six times. The average bounce height of the last three drops is reported. A smooth release of the plunger produces the most reproducible results.

B. Hardness Test Method 150 grams of raw resin are placed between two sheets of silicone-coated mylar and the resulting sandwich is positioned in the center of the molding press. 150 tons of force are applied @70° C. for 5 seconds. Six to eight 4 inch×4 inch squares of the resulting pressed, raw resin are cut out and stacked. The weight of the stack should be 75 to 80 grams.

The resin stack is placed in the center of a square steel frame mold with internal dimensions of 6 inch×6 inch×3 mm thick. The resin stack and steel frame are placed between 2 sheets of silicone-coated mylar and the resulting assemblage positioned in the center of the molding press. 100 tons of force are applied @70° C. for 20 seconds. The above-described procedure is repeated until there is enough bubble-free resin to cut out two 5 cm×5 cm squares.

The molded resin is exposed for 5 minutes to a medium pressure mercury vapor lamp, and mounted in a Newsprinter II exposure unit (NAPP SYSTEMS INC., San Marcos, Calif.) while still in the mold. The square is turned over and the other side exposed for an additional 5 minutes.

Approximately ½ inch of cured resin is trimmed from each side of the 6 inch×6 inch square. Two 5 cm×5 cm squares are cut out and stacked with a thickness tolerance of ±50 microns. The resin stack is placed in a constant temperature room at a temperature of 25° C. for 2 hours before making any measurements.

The Shore automatic operating stand is adjusted so that the bottom plate of the durometer (not the indenter) is approximately ¼ inch from the specimen. This procedure is used for calibrating the durometer with standards and for making specimen measurements. The automatic operating stand is then turned on and five measurements are made, ½ inch from the edge at each corner and in the center. The stack is turned over and five more measurements are made.

The average and standard deviation of the ten measurements is then reported.

C. Instron Method

For sample testing, a 100 Kg (1 KN) load cell on an Instron Strain Gauge Extensometer Model 4202 (Instron Corporation, Canton, Mass.) is used. Instrument parameters employed include:

| | |
|---|---|
| Sample width | 10 mm, |
| Gauge length | 50 mm, |
| Grip distance | 70 mm, and |
| Cross head speed | 75 mm/min. |

A dumbbell sample (~1.7 mm thick, fully cured resin) is inserted between clamps (positioned about 70 mm apart) and tightened well. It is desirable for the sample to be as straight as possible, with as little slack as possible.

Enter the mean thickness for the sample, and start the instrument. Repeat for each sample (about 8–10 samples should be tested to obtain good statistical results). The instrument's computer will calculate mean values for tensile strength and % elongation.

EXAMPLE 5

Test Results

The photopolymer resins described above were placed between a steel substrate (which had been previously coated with ~2 micron adhesive layer) and a sheet of silicon-treated polyester. This assembly was heat pressed and calendared until the thickness of the photopolymer resin reached 15.5 mils ±0.5. The silicon-treated polyester was removed and the top of the photopolymer was then coated with a matte coating comprising a thin layer of silica particles suspended in an aqueous polyvinylalcohol solution, and allowed to air dry.

The resulting plates were cured under a variety of conditions and the physical properties determined for the resulting plate. Results are presented in the tables which follow. Table 1 summarizes the physical properties of resins cured upon exposure with a conventional 5 kilowatt UV lamp.

TABLE 1

Physical Properties

| | Composition | | |
|---|---|---|---|
| Property | Comparison | Inv. A | Inv. B |
| Shore A | 71 | 72 | 66 |
| Resilience, % rebound | 27 | 31 | 58 |
| Tensile strength, g/mm² | 368 | 656 | 398 |

TABLE 1-continued

Physical Properties

| | Composition | | |
|---|---|---|---|
| Property | Comparison | Inv. A | Inv. B |
| Elongation, % | 131 | 144 | 131 |

Table 2 summarizes the dot holding properties of the resins when cured by exposure with a conventional 5 kilowatt UV lamp.

TABLE 2

Plate Dot Sizes for an 85 lpi screen (Exposure time[1])

| MASK | Comparison Composition (4.5; 50) | Invention Composition A[2] (2.0; 11) | Invention Composition B (1.9; 10) |
|---|---|---|---|
| 3% | 2.4 mils | 1.6 mils | 1.2 mils |
| 5 | 3.6 | 3.1 | 2.8 |
| 10 | 5.0 | 4.4 | 4.1 |
| 20 | 6.0 | 5.5 | 5.3 |
| 30 | 7.4 | 6.9 | 6.6 |
| 40 | 8.0 | 7.8 | 7.3 |
| 50 | 8.8 | 8.5 | 8.2 |
| 60 | 7.8 | 8.0 | 8.4 |
| 70 | 6.3 | 6.6 | 7.0 |
| 80 | 5.2 | 5.4 | 5.8 |
| 90 | 4.3 | 4.4 | 4.8 |
| 95 | 3.1 | 3.2 | 3.4 |

[1]The exposure time (in seconds) is presented as two values, the first number is the duration of the "bump" exposure and the second number is the duration of the main exposure
[2]From 3 . 50%, i.e., above the line dividing the table of values, smaller values represent better performance, while from 60–95%, i.e., below the line dividing the table of values, larger values represent better performance The horizontal line shows the point of inversion of the halftone image. Above the line, the diameter of the halftone dot surface is measured. Below the line, the surface is more than 50% solid so the diameter of the "holes" in the surface are measured. These are the shadow dots. Because of this inversion, smaller numbers are better at 50% and below, and larger numbers are better at 60% and above.

The invention composition described in Examples 1 and 2 can be seen to provide more colorless in quartertones and midtones and finer highlight dot holding with respect to prior art compositions (of which Example 3 is illustrative).

Invention compositions can also be seen to provide significantly faster exposures than prior art compositions, as follows. Typically, exposure time for a plate prepared from prior art resin (see, for example, Example 3) will be in the range of about 4.5×50 seconds (where the first number is the duration of the "bump" exposure and the second number is the duration of the main exposure), while suitable exposure times required for invention compositions (see, for example, Example 1) are approximately 2.0×11 seconds. These rapid exposure times for the invention compositions are achieved without any compromise in shelf life of the unexposed plate.

It can also be observed that invention compositions provide better resilience than prior art compositions from the following qualitative test. If one pushes down on the cured plate surface with a pen point or other probe, it can be seen that the plate prepared using invention composition rebounds more quickly than a plate prepared from prior art composition.

Finally, it can also be seen that invention compositions provide improved toughness, relative to prior art compositions, thereby making possible longer run lengths. Thus, while run length results are always variable due to press conditions and other factors, plates prepared from prior art composition give an average run length of approximately 150,000, while plates prepared from invention compositions show no signs of plate failure on press print runs of up to 300,000.

The reactivity of each of the above-described resins upon exposure to laser (e.g., an argon laser at a wavelength in the range of about 332–365 nm) is presented in Table 3.

TABLE 3

| Exposure[1] required | Composition | | |
|---|---|---|---|
| to hold | Comparison | Inv. A | Inv. B |
| 2% highlight dot | >1000[2] | 80 | 100 |
| 50μ fine lines | >1000[2] | 80 | 100 |

[1]Exposure is reported as millijoules/cm$^2$ (mj/cm$^2$); all compositions were subjected to a sensitizing pre-exposure of 10–18 mj/cm$^2$ just prior to the imaging exposure; laser spot size was ~22 microns; irradiance ~37–73 kW/cm$^2$.
[2]Features were still not held by the comparison composition even at 1000 seconds of exposure time.

Review of the data presented in Table 3 illustrates the dramatically improved exposure sensitivity provided by invention compositions.

While the invention has been described in detail with reference to certain preferred embodiments thereof, it will be understood that modifications and variations are within the spirit and scope of that which is described and claimed.

That which is claimed is:

1. A highly sensitive, water-developable photoreactive resin composition comprising:
   (A) in the range of about 40 up to about 60 wt % of at least one copolymer comprising in the range of:
      (i) about 5 up to about 95 mol % of at least one aliphatic conjugated diene monomer,
      (ii) about 1 up to about 30 mol % of at least one α,β-ethylenically unsaturated carboxylic acid,
      (iii) about 0.1 up to about 10 mol % of at least one polyfunctional vinyl monomer, and
      (iv) 0 up to about 70 mol % of at least one monofunctional vinyl monomer;
   (B) in the range of about 0.8 up to about 1.2 mol of at least one washout aid per mol of carboxyl groups in copolymer (A),
   (C) in the range of about 5 up to about 10 wt % of a linear thermoplastic, elastomeric block polymer having at least one unit of the general formula (A-B-A), (A-B)$_n$ or (A-B), wherein A is a non-elastomeric polymer block having a number average molecular weight of 2,000 to 100,000 and a glass transition temperature above about 25° C., and B is an elastomeric polymer block having a number average molecular weight of about 25,000 to about 1,000,000 and a glass transition temperature below about 10° C.,
   (D) in the range of about 4 up to about 8 wt % of at least one monofunctional, ethylenically unsaturated monomer having the structure:

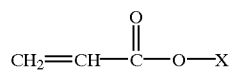

wherein X is an alkyl group having in the range of about 8 up to about 18 carbon atoms, (E) in the range of about 10 up to about 14 wt % of at least one polyfunctional, ethylenically unsaturated monomer having the core structure:

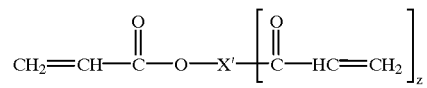

wherein X' is selected from:
      (a) alkylene or substituted alkylene having in the range of 1 up to about 15 carbon atoms, and z is 1, or
      (b) oxyalkylene or substituted oxyalkylene having in the range of 1 up to about 150 carbon atoms, and z is 1, or
      (c) a polyvalent alkylene or oxyalkylene moiety, wherein z is 2 or 3, or
      (d) a bisphenolyl moiety,
   and
   (F) in the range of about 0.01 up to about 10 wt % of a phosphine-containing photopolymerization initiation system.

2. A composition according to claim 1, wherein said copolymer comprises in the range of:
   (i) about 40 up to about 85 mol % of at least one aliphatic conjugated diene monomer,
   (ii) about 2.5 up to about 15 mol % of at least one α,β-ethylenically unsaturated carboxylic acid,
   (iii) about 0.5 up to about 5 mol % of at least one polyfunctional vinyl monomer, and
   (iv) about 5 up to about 30 mol % of at least one monofunctional vinyl monomer.

3. A composition according to claim 1, wherein said aliphatic conjugated diene monomer is butadiene or isoprene, said α,β-ethylenically unsaturated carboxylic acid is (meth)acrylic acid, carboxyethyl acrylate (β-CEA) or carboxyethyl methacrylate, said polyfinctional vinyl monomer is ethyleneglycol di(meth)acrylate, divinyl benzene, or 1,6-hexanediol di(meth)acrylate, and said monofunctional vinyl monomer is ethyl (meth)acrylate, methyl (meth)acrylate, dimethylaminopropyl (meth)acrylate, diethylaminopropyl (meth)acrylate, dimethylaminopropyl (meth)acrylamide, diethylaminopropyl (meth)acrylamide, or a mixture of any two or more thereof.

4. A composition according to claim 1, wherein said washout aid is:
   a basic nitrogen-containing compound,
   an alkali metal hydroxide,
   an alkali metal carbonate,
   an alkali metal salt of an organic acid,
   or a mixture of any two or more thereof.

5. A composition according to claim 1, wherein said washout aid is N,N-dimethylaminopropyl methacrylamide, N,N-dimethylaminoethyl methacrylamide, N,N-dimethyldodecylamine, N,N-dimethylamino-propylamine, N,N-dimethyltoluidine, triphenylamine, diethylamine, triethylamine, N,N-diethylaminoethanol, N,N-dimethylaminopropanol, N,N-dimethylamino-propanamine, C-2-alkyldimethylamine C-8alkyldimethylamine, N,N-dimethylamino-ethylmethacrylate (Ageflex FM2), N(N,N-dimethylamino)propyl-2-pyrrolidone, 1,3-bis(dimethylamino)propane, 1,6-bis(dimethylamino)hexane, a compound of the structure

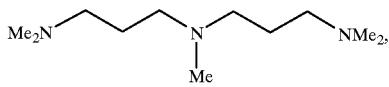

a compound of the structure

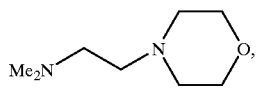

a compound of the structure

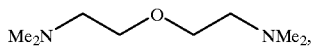

or a mixture of any two or more thereof.

6. A composition according to claim 1, wherein said linear thermoplastic, elastomeric block polymer is a polystyrene-polybutadiene-polystyrene block polymer, a polystyrene-polyisoprene-polystyrene block polymer, or a polystyrene-polychloroprene-polystyrene block polymer.

7. A composition according to claim 1, wherein said monofunctional ethylenically unsaturated monomer (D) is caprylyl acrylate, capryl acrylate, lauryl acrylate, myristyl acrylate, palmityl acrylate, stearyl acrylate, oleyl acrylate, or a mixture of any two or more thereof.

8. A composition according to claim 1, wherein said polyfunctional ethylenically unsaturated monomer (E) is 1,4-butanediol diacrylate, 1,6-hexanediol diacrylate, polyethylene glycol diacrylate, ethoxylated trimethylol propane triacrylate, propoxylated neopentyl glycol diacrylate, ethoxylated bisphenol A diacrylate, propoxylated glyceryl triacrylate, or a mixture of any two or more thereof.

9. A composition according to claim 1, wherein said phosphine-containing photopolymerization initiation system comprises at least one phosphine-containing photoinitiator and, optionally one or more non-phosphorus-containing photoinitiators.

10. A composition according to claim 9, wherein said phosphine-containing photoinitiator is 2,6-dimethoxybenzoyl phenylphosphinate, 2,6-dimethylbenzoyl diphenylphosphine oxide, 2,4,6-trimethylbenzoyl diphenylphosphine oxide, bis(2,6-dimethoxybenzoyl)-2,4,4-trimethylpentyl phosphine oxide, or ethyl 2,4,6-trimethylbenzoylphenylphosphinate.

11. A composition according to claim 9, wherein said non-phosphorus-containing photoinitiator is xanthone, thioxanthone, 2-chloroxanthone, benzil, benzophenone, 4,4'bis(N,N'-dimethylamino)benzophenone, 9,10-anthraquinone, 9,10-phenanthrenequinone, 2-ethyl anthraquinone, 1,4-naphthoquinone, oligo[2-hydroxy-2-methyl-1-[4-(1-methylvinyl)phenyl]propanone], α-diketone compounds or monoketal derivatives thereof, acyloins or acyloin ethers, hydroxyalkyl acetophenones, or a mixture of any two or more thereof.

12. A composition according to claim 9, wherein the ratio of said phosphine-containing photoinitiator component to said non-phosphorus-containing photoinitiator falls in the range of about 1:1 up to about 1:10.

* * * * *